US012476070B2

(12) United States Patent
Tanuma et al.

(10) Patent No.: US 12,476,070 B2
(45) Date of Patent: Nov. 18, 2025

(54) CHARGED PARTICLE BEAM DEVICE AND SCAN WAVEFORM GENERATION METHOD

(71) Applicant: Hitachi High-Tech Corporation, Tokyo (JP)

(72) Inventors: Keisuke Tanuma, Tokyo (JP); Masato Kamio, Tokyo (JP); Hironori Itabashi, Tokyo (JP); Hiroki Kannami, Tokyo (JP); Yusuke Seki, Tokyo (JP); Takumi Uezono, Tokyo (JP); Mitsuhiro Nakamura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 425 days.

(21) Appl. No.: 18/012,478

(22) PCT Filed: Jul. 13, 2020

(86) PCT No.: PCT/JP2020/027252
§ 371 (c)(1),
(2) Date: Dec. 22, 2022

(87) PCT Pub. No.: WO2022/013918
PCT Pub. Date: Jan. 20, 2022

(65) Prior Publication Data

US 2023/0260739 A1 Aug. 17, 2023

(51) Int. Cl.

| | |
|---|---|
| ***H01J 37/153*** | (2006.01) |
| ***H01J 37/147*** | (2006.01) |
| ***H01J 37/28*** | (2006.01) |

(52) U.S. Cl.
CPC ........ *H01J 37/153* (2013.01); *H01J 37/1474* (2013.01); *H01J 37/28* (2013.01); *H01J 2237/1536* (2013.01)

(58) Field of Classification Search
CPC .......... H01J 37/00; H01J 37/02; H01J 37/153; H01J 37/1474; H01J 37/26; H01J 37/28;
(Continued)

(56) References Cited

U.S. PATENT DOCUMENTS

| | | | | |
|---|---|---|---|---|
| 6,703,623 | B1 * | 3/2004 | Shimazu | G03F 7/2037 850/16 |
| 9,793,091 | B1 * | 10/2017 | Teshima | H01J 37/265 |

(Continued)

FOREIGN PATENT DOCUMENTS

| | | |
|---|---|---|
| JP | 2008-14850 A | 1/2008 |
| JP | 2018-195545 A | 12/2018 |

OTHER PUBLICATIONS

International Search Report (PCT/ISA/210) issued in PCT Application No. PCT/JP2020/027252 dated Sep. 8, 2020 with English translation (six (6) pages).

(Continued)

*Primary Examiner* — Jason L McCormack
(74) *Attorney, Agent, or Firm* — Crowell & Moring LLP

(57) ABSTRACT

It is aimed to properly correct the various types of distortion without a reduction in observation throughput. The present disclosure provides a charged particle beam device that obtains an image by irradiating a specimen with a charged particle beam and includes: a deflection coil that scans the charged particle beam on the specimen; a D/A converter that converts a digital scan waveform into an analog scan waveform and outputs the analog scan waveform to the deflection coil to drive the deflection coil; and a scan waveform generation unit that generates a digital scan waveform and outputs the digital scan waveform to the D/A converter, in which the scan waveform generation unit has a basic LUT that stores parameters for correcting the digital scan wave- (Continued)

form and includes a correction circuit that corrects a distortion characteristic of the deflection coil.

10 Claims, 15 Drawing Sheets

(58) Field of Classification Search
CPC ........... H01J 37/1475; H01J 2237/1536; H01J 2237/28
USPC .......................................... 250/306, 307, 311
See application file for complete search history.

(56) References Cited

U.S. PATENT DOCUMENTS

| | | | | |
|---|---|---|---|---|
| 2003/0116709 | A1* | 6/2003 | Kazumori ............... | H01J 37/28 250/307 |
| 2008/0093551 | A1* | 4/2008 | Tsuneta ..................... | G06T 5/80 382/255 |

OTHER PUBLICATIONS

Japanese-language Written Opinion (PCT/ISA/237) issued in PCT Application No. PCT/JP2020/027252 dated Sep. 8, 2020 (five (5) pages).

* cited by examiner

[FIG. 1]
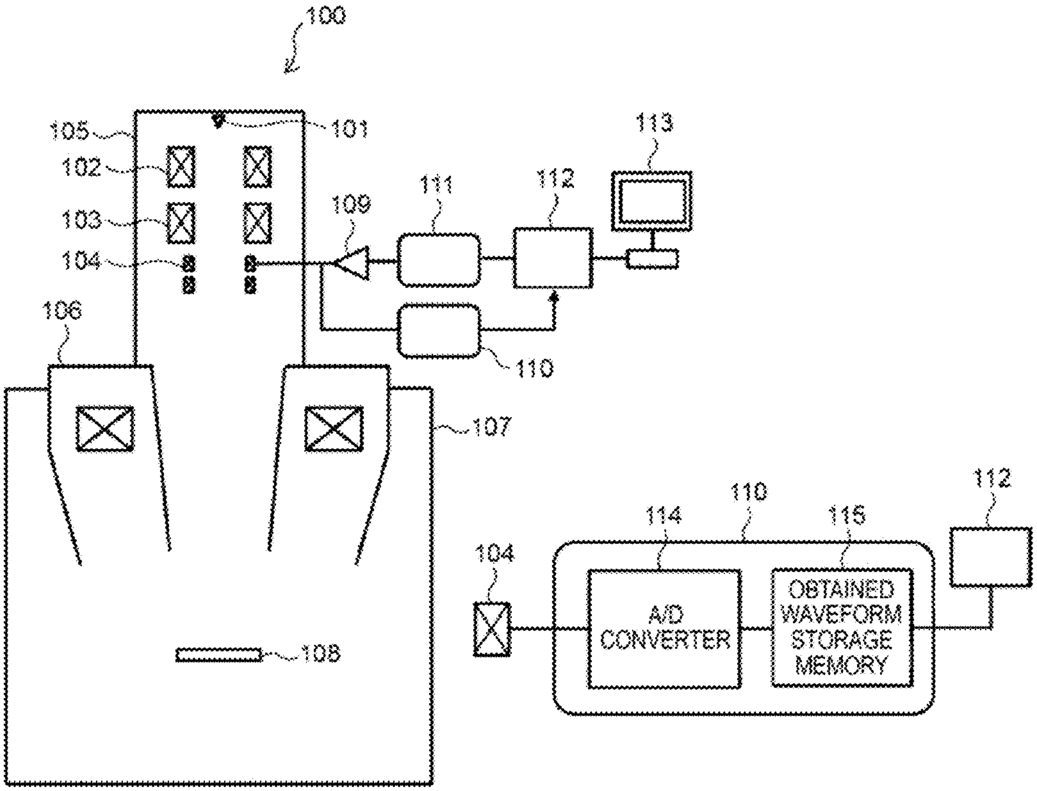

[FIG. 2]
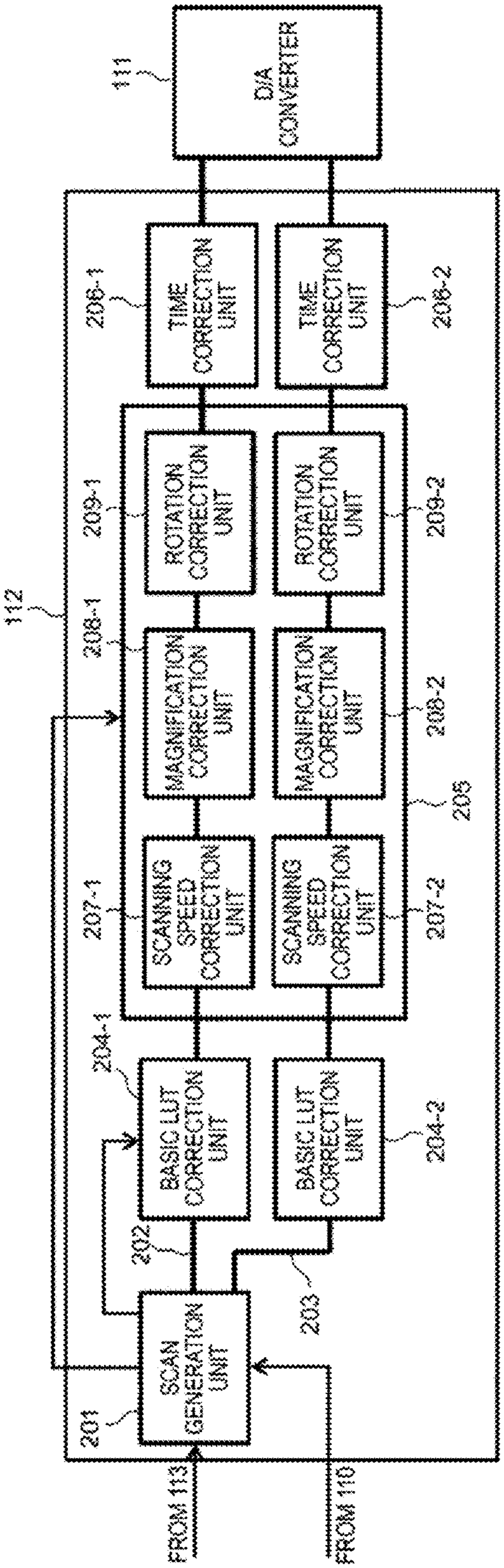

[FIG. 3]
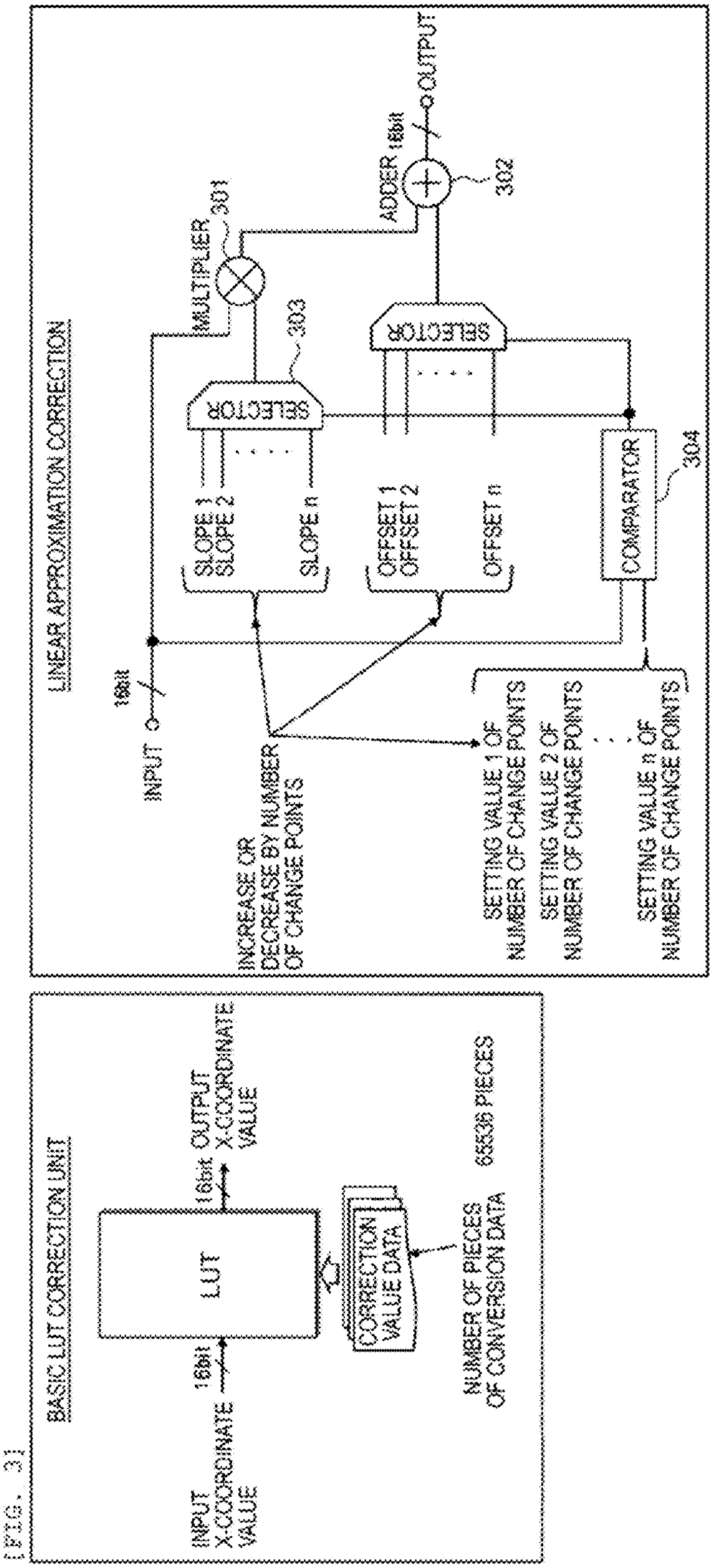

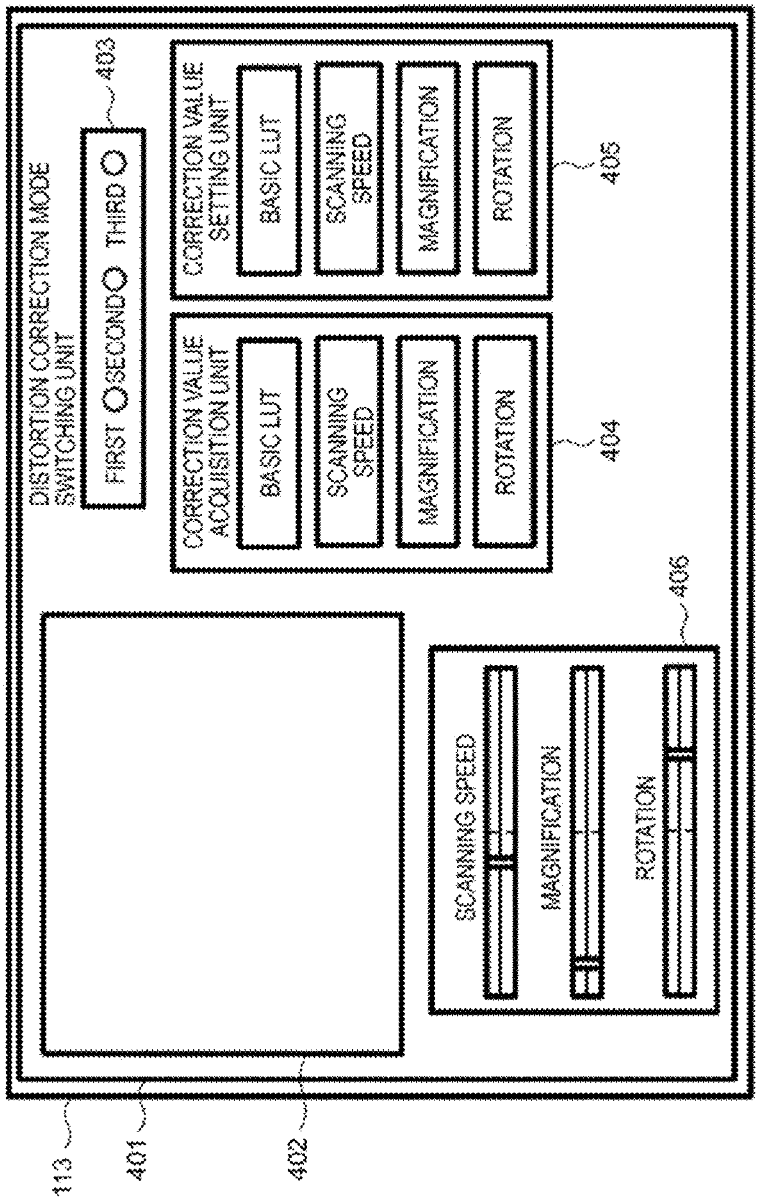
[FIG. 4]

[FIG. 5]
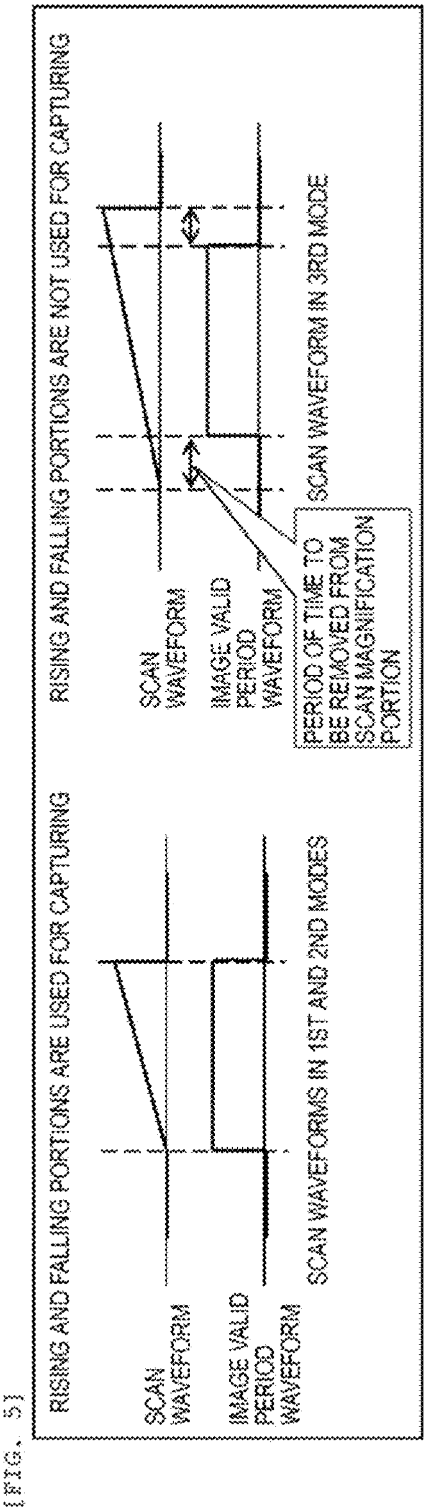

[FIG. 6]
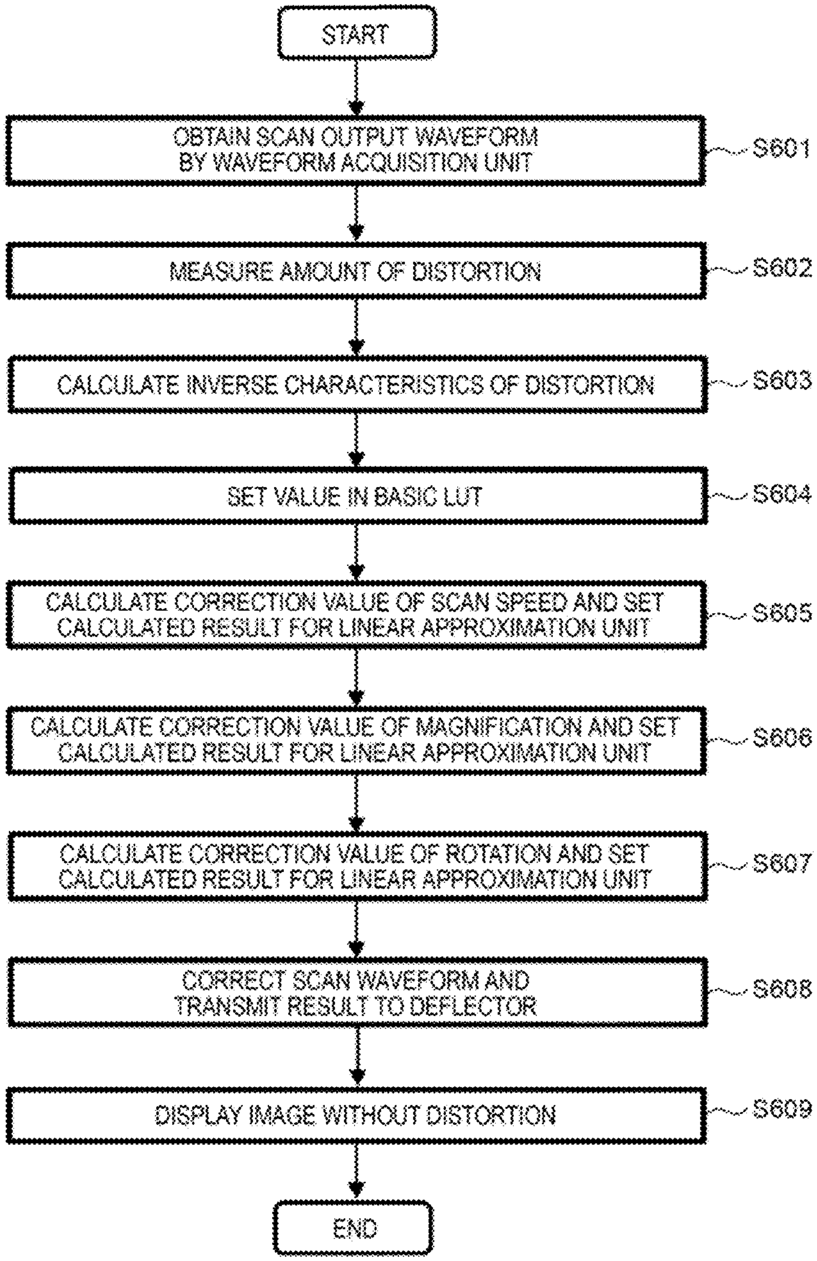

[FIG. 7]
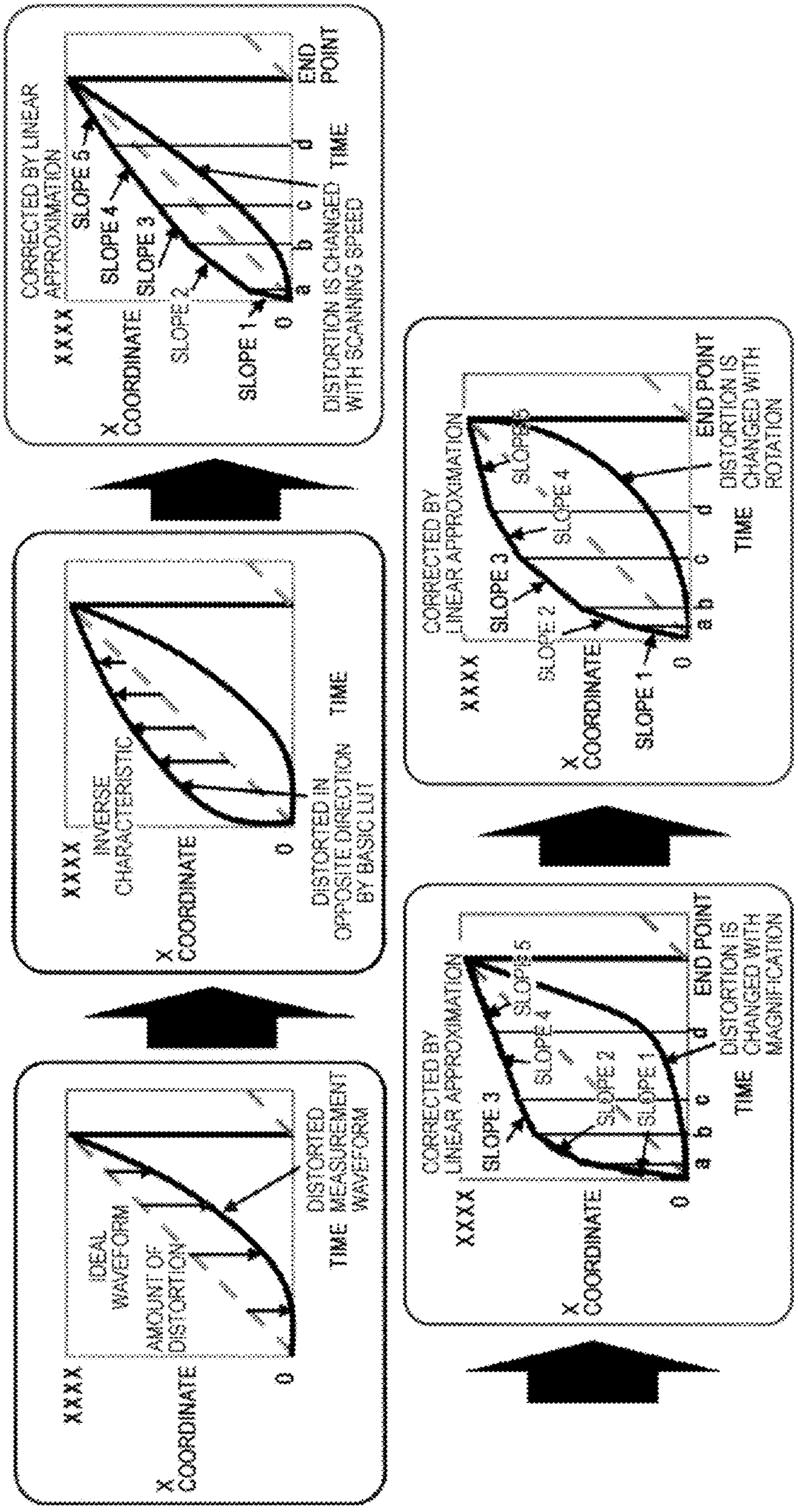

[FIG. 8]
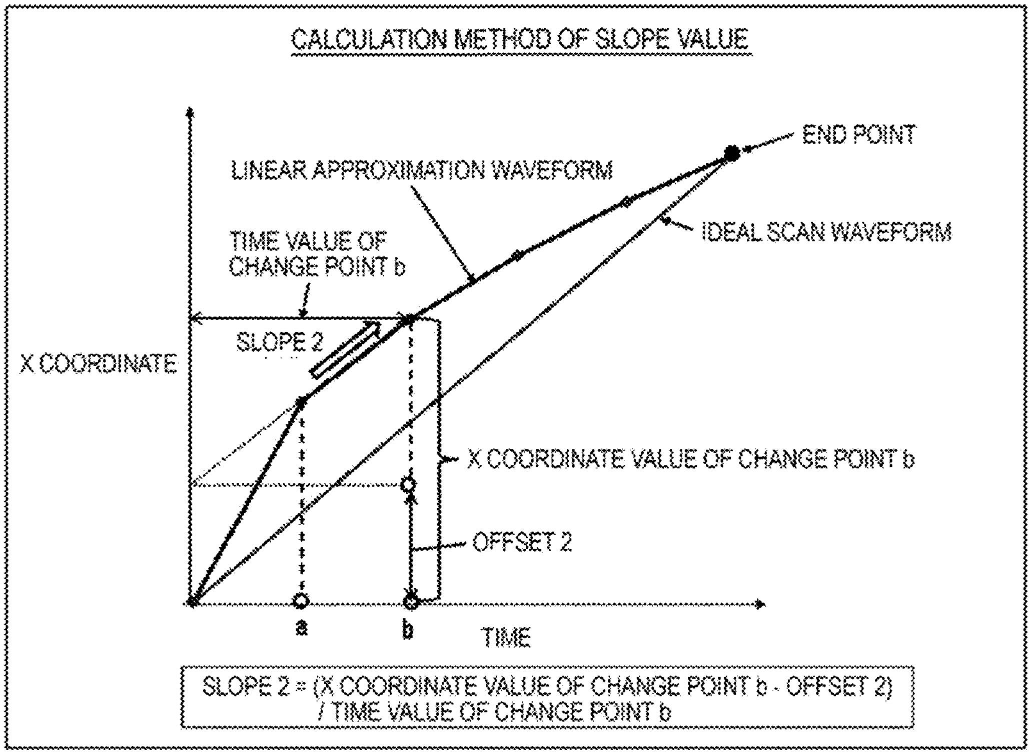
[FIG. 9]
| | | COMPARATIVE EXAMPLE ENTIRELY LUT | LUT + LINEAR APPROXIMATION |
|---|---|---|---|
| CIRCUIT SIZE | LOGIC | — | NUMBER% |
| | MEMORY | 8.39Mbit<br>·1,048,576bit × 4 PIECES × 2(X/Y) | 2.10Mbit<br>·1,048,576bit × 2(X/Y) |
| | CALCULATOR | — | 18 PIECES<br>3 × 3 × 2(X/Y) |
| REGISTER SETTING TIME | | 393,280 TIMES × T<br>·(65536 DEPTH × 3 TYPES + 32 DEPTH) × 2(X/Y) | 196 TIMES × T<br>·(22* × 3 TYPES + 32) × 2(X/Y) |

[FIG. 10]
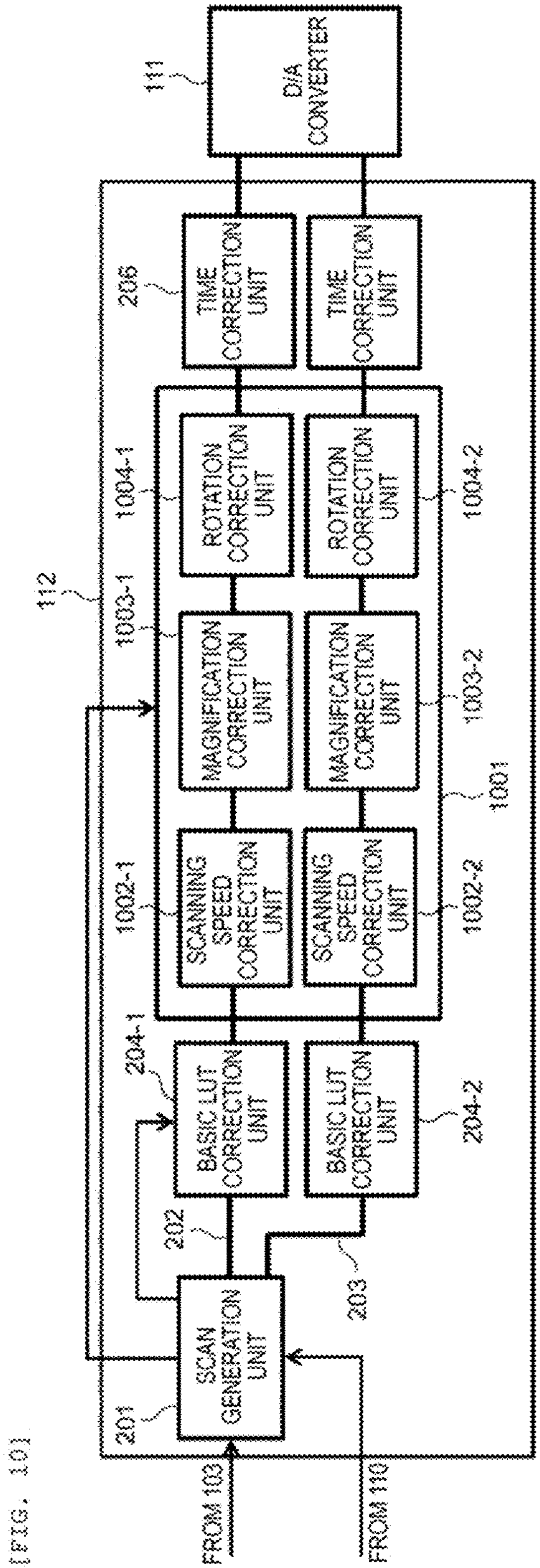

[FIG. 11]
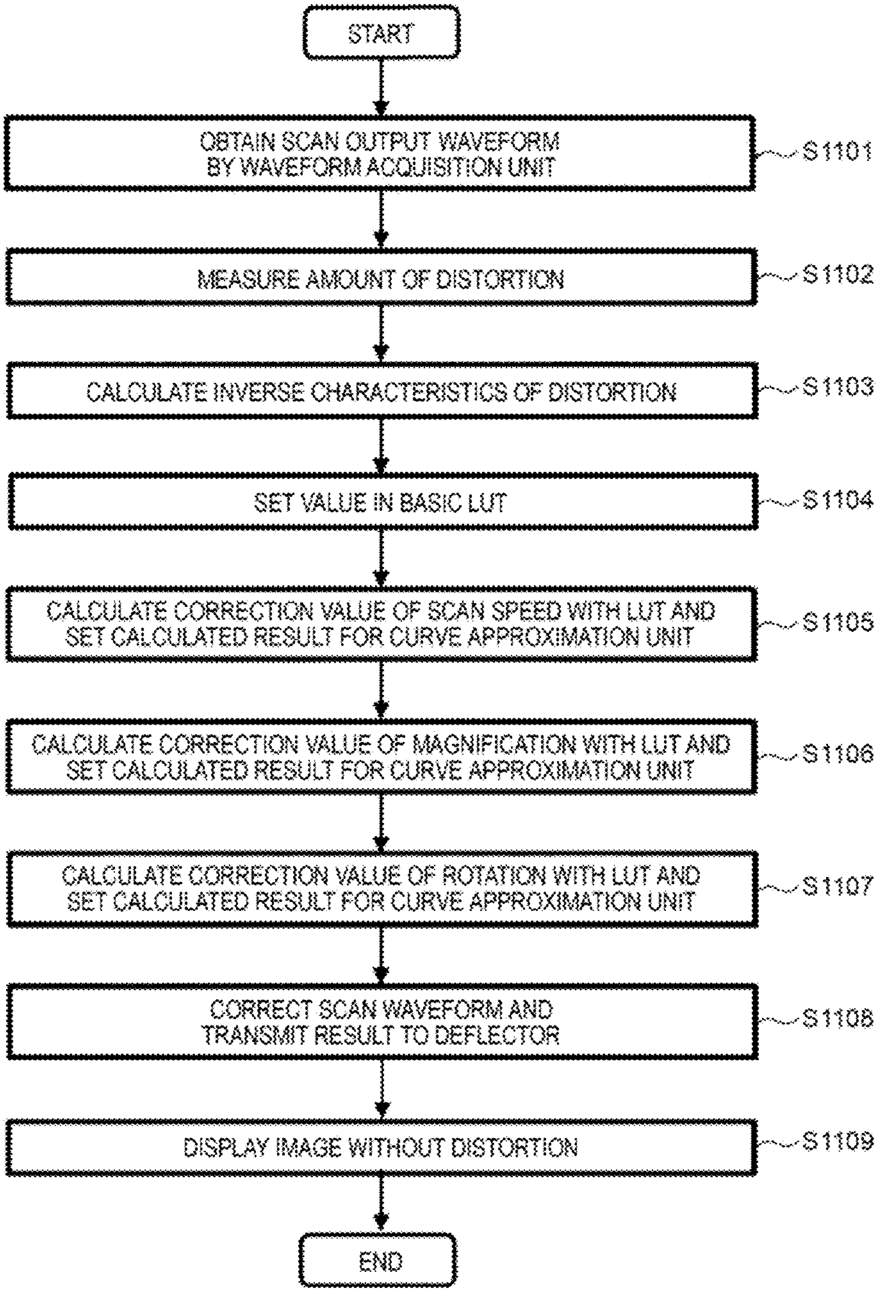

[FIG. 12]
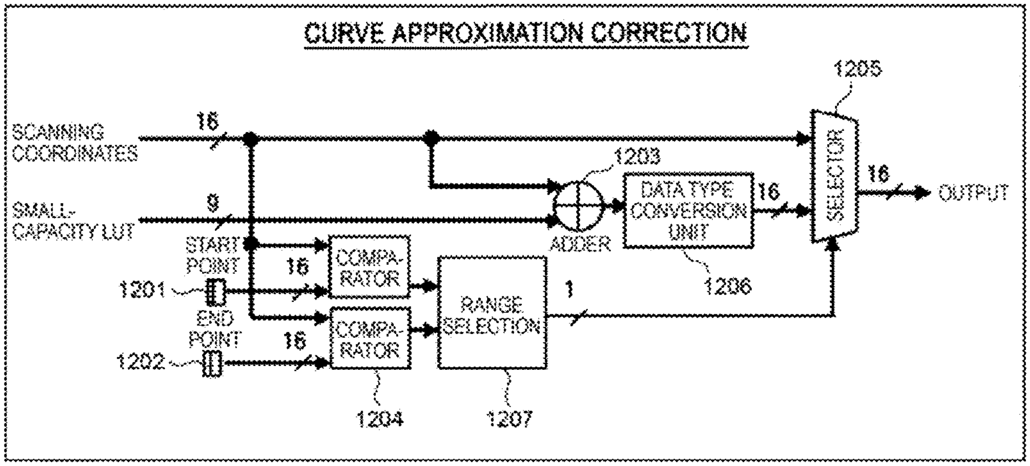
[FIG. 13]
| | | COMPARATIVE EXAMPLE ENTIRELY LUT | LUT + CURVE APPROXIMATION |
|---|---|---|---|
| FPGA CIRCUIT SIZE | LOGIC | — | NUMBER% |
| | MEMORY | 8.39Mbit<br>·1,048,576bit × 4 PIECES × 2(X/Y) | 2.15Mbit<br>·1,048,576bit × 2(X/Y)<br>·4,608bit × 6 PIECES =27648 |
| | CALCULATOR | — | 6 PIECES<br>1 × 3 × 2(X/Y) |
| REGISTER SETTING TIME | | 393,280 TIMES x T<br>·(65536 DEPTH × 3 TYPES + 32 DEPTH) × 2(X/Y) | 3136 TIMES x T<br>·(512 DEPTH × 3 TYPES + 32 DEPTH) × 2(X/Y) |

[FIG. 14]
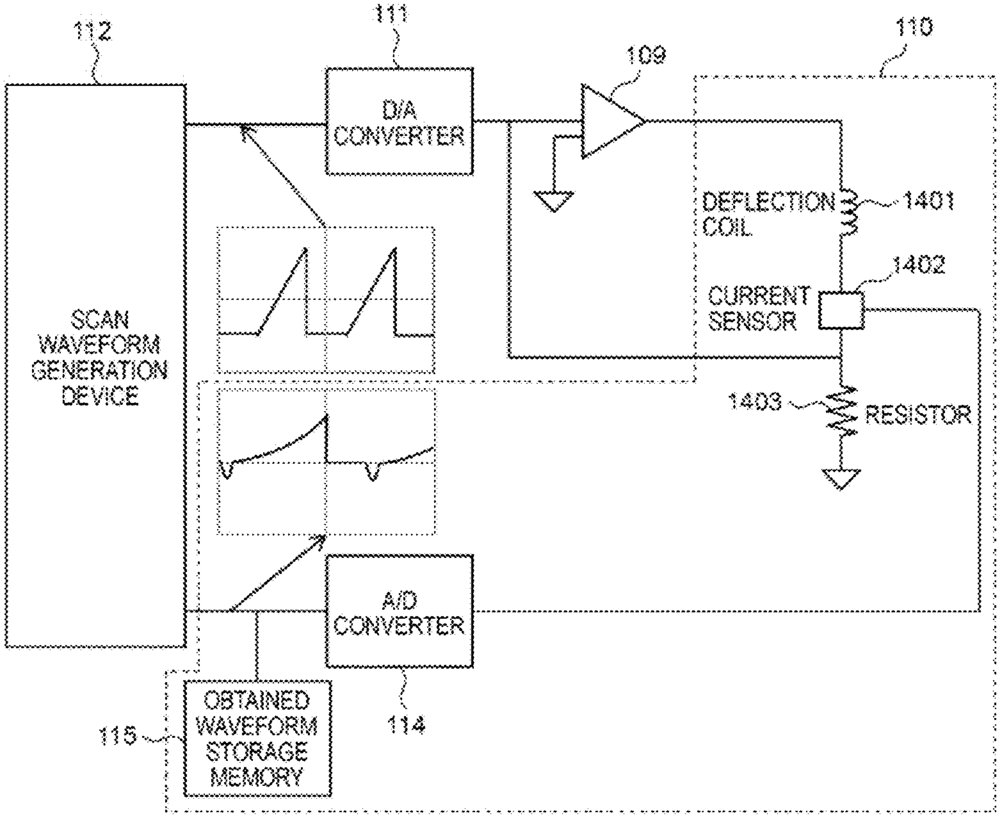

[FIG. 15]
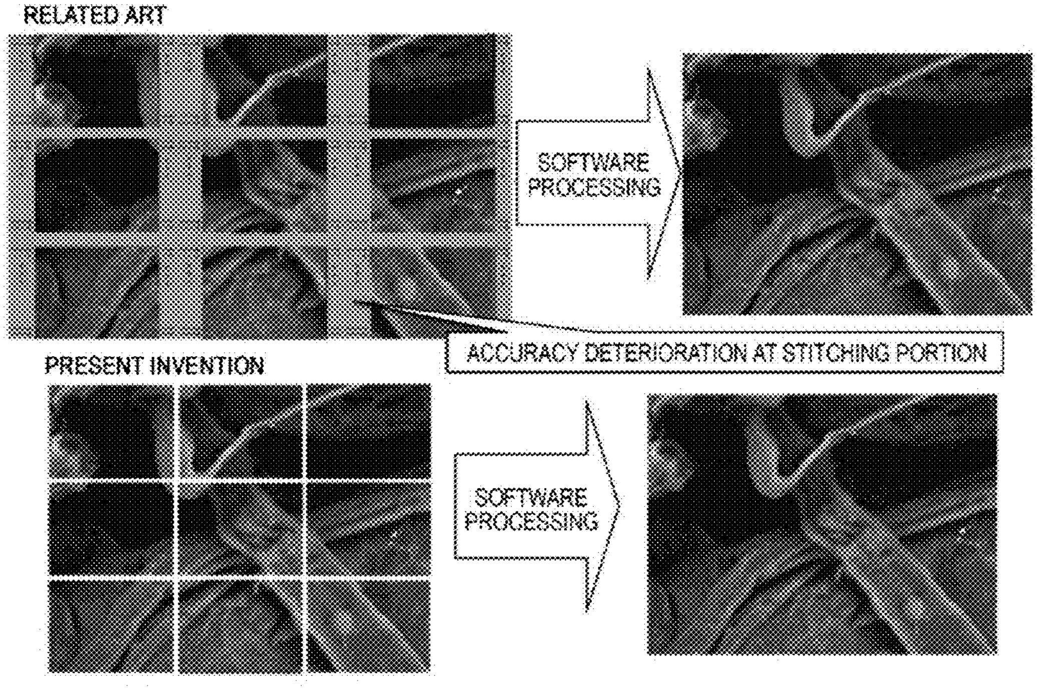
[FIG. 16]
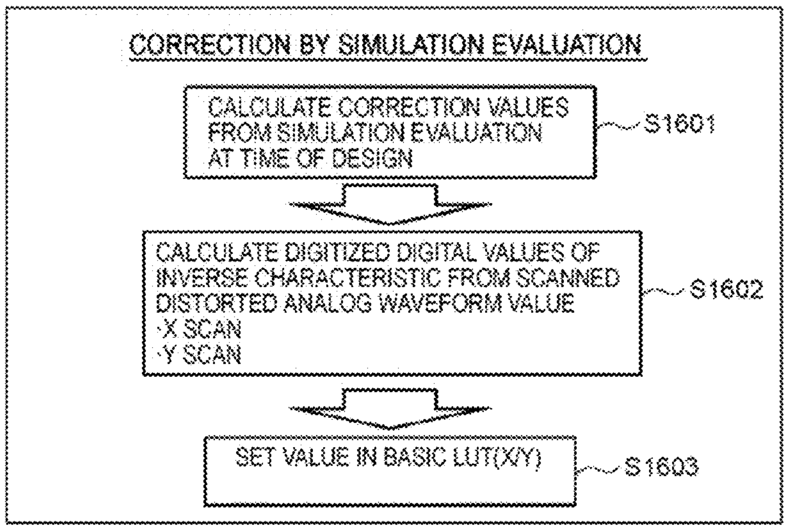

[FIG. 17]
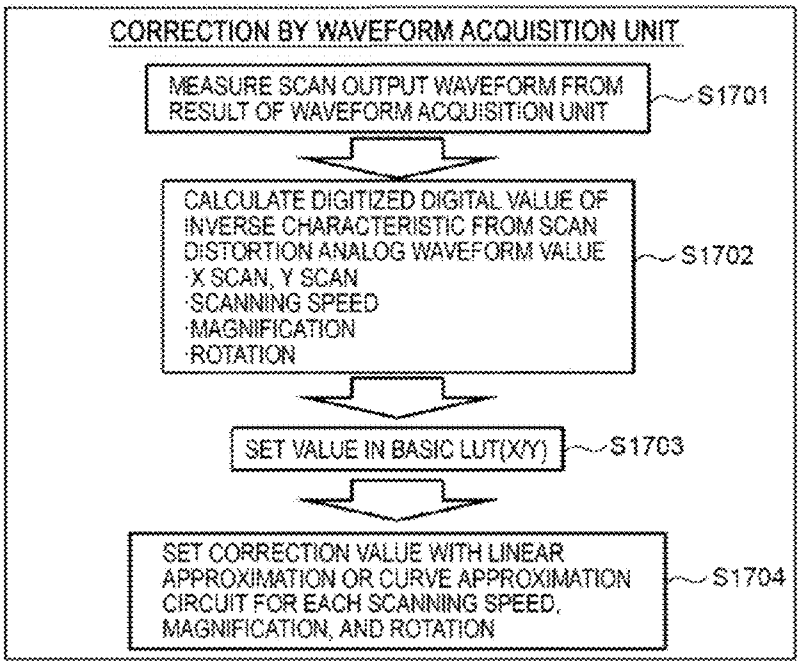
[FIG. 18]
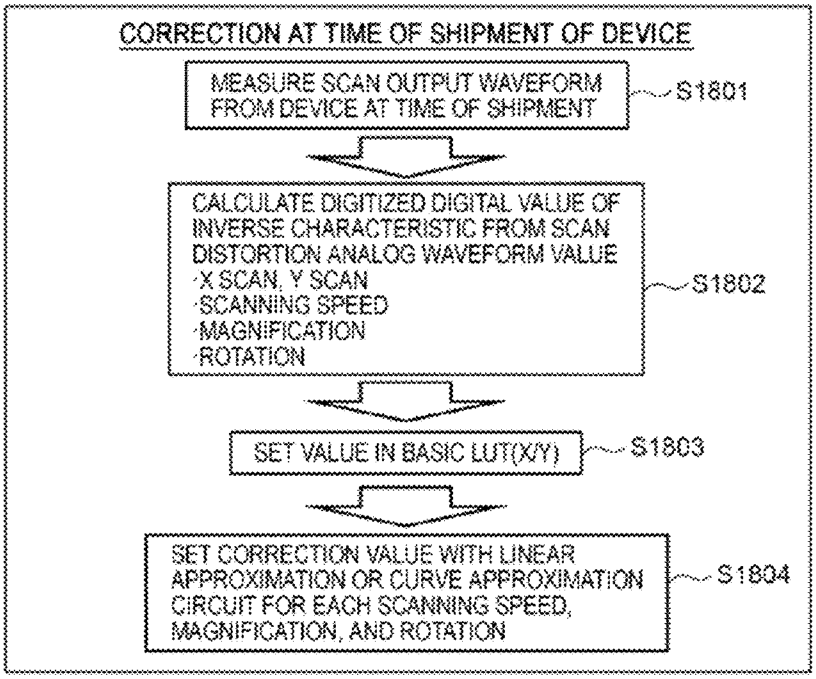

[FIG. 19]
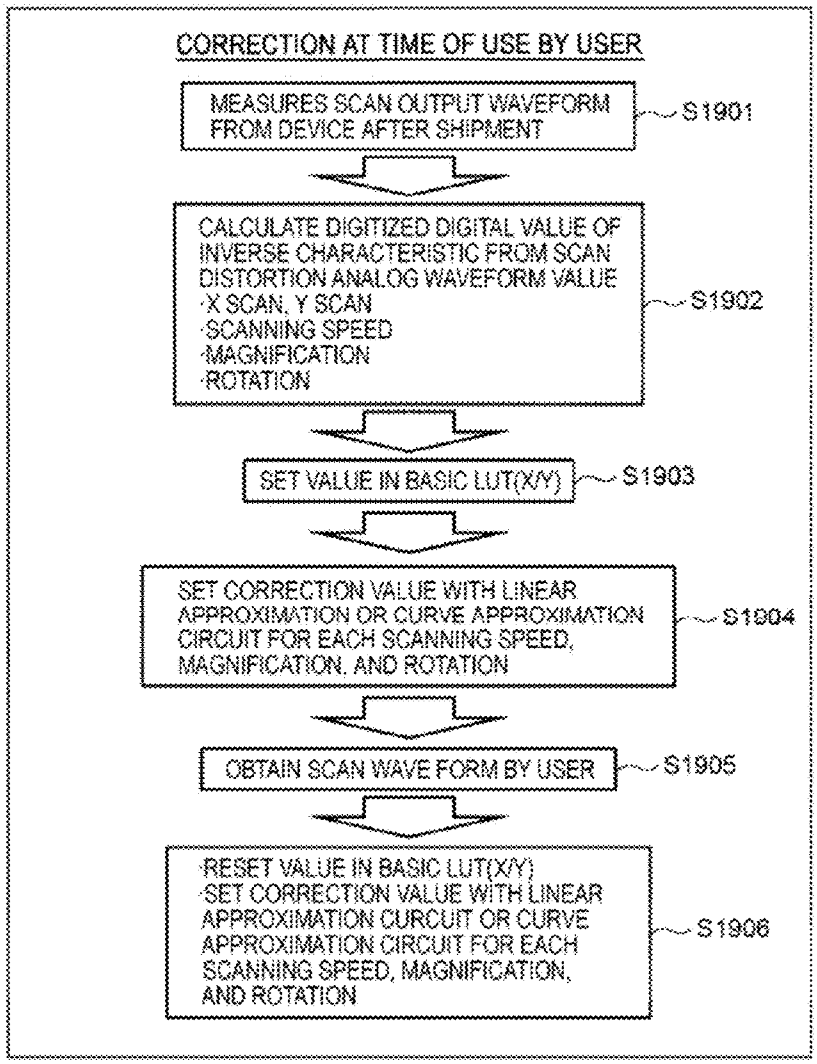

CHARGED PARTICLE BEAM DEVICE AND SCAN WAVEFORM GENERATION METHOD

TECHNICAL FIELD

The present disclosure relates to a charged particle beam device and a scan waveform generation method.

BACKGROUND ART

In recent years, the miniaturization of semiconductor processes and advancement in nanotechnology gave rise to a need for the observation of shapes of micro-regions in various specimens. The observation of these micro-regions is performed by obtaining image information of the observation region with a scanning electron microscope (SEM) or the like using electron beam technology. A device using such a scanning electron microscope (SEM) sequentially irradiates a specimen with an electron beam at a predetermined acceleration voltage along a plurality of scanning lines to scan an observation target area on the specimen, and detects the emitted secondary electrons to observe the specimen in the observation target area, but with the recent advancement in the miniaturization of semiconductor processes or nanotechnology, high resolution is essential. In addition, to enable the use in specimen observation in a wide range of fields such as semiconductor devices, electronics, advanced nanotechnology materials, biology, pharmaceuticals, and the like, there is a demand for higher image quality and improved usability of observation images, and lower costs for SEM devices. For the image processing systems applied to these SEM devices, it is necessary to provide not only the real-time processing performance to achieve high resolution, but also the multi-channel input of image information from various detectors corresponding to various fields, and the cost reduction. In particular, in specimen observation using the scanning electron microscope (SEM), since a distortion in the scanning coordinates for scanning with an electron beam results in the deterioration of the observed image, it is important to have a scan distortion correction.

For example, JP2008-014850A (PTL 1) discloses a technique related to the scan distortion correction. PTL 1 describes that "A geometric distortion at a first magnification is measured as an absolute distortion based on a standard specimen having a cyclic structure. A microscopic structure specimen is photographed at a geometric distortion measured first magnification and at a geometric distortion unmeasured second magnification. A scaled image that is obtained by isotropically scaling the image photographed at the first magnification to the second magnification is generated. The geometric distortion at the second magnification is measured as a relative distortion based on the scaled image. The absolute distortion at the second magnification is obtained on the basis of the absolute distortion at the first magnification and the relative distortion at the second magnification. Subsequently, the second magnification is replaced with the first magnification, and the relative distortion measurement is repeated, and a geometric distortion at an arbitrary magnification is measured and corrected.".

CITATION LIST

Patent Literature

PTL 1: JP2008-014850A

SUMMARY OF INVENTION

Technical Problem

As described above, PTL 1 measures the magnification image distortion from two images with different magnifications, and corrects only the magnification distortion.

However, there are various causes of image distortion in the scanning electron microscopes. Therefore, applying the technique disclosed in PTL 1 only cannot correct the distortions other than the magnification distortion. According to the viewing conditions, image distortion is conspicuous and the image is distorted. Moreover, it cannot be said that preparing a standard specimen having a periodic structure and performing repeated measurements to correct the distortion is an efficient and best distortion prevention measure.

In addition, in general, as a method of performing correction, there is a method of storing correction values in advance in a Look Up Table (LUT) and outputting the correction values according to coordinate values of scanning. In this case, in order to correct for all the conditions of the magnification distortion, distortion of the current flowing in the deflection coil of the electron beam, scanning speed, and distortion due to the scanning direction of the electron probe (raster rotation), respectively, it is necessary to store the correction value for each condition in the LUT, or rewrite the contents of the LUT for each condition. Storing in advance requires an enormous memory capacity, and performing rewriting for each condition requires a large amount of memory writing time. Furthermore, in the related art, the scanning time is increased and a central portion of the waveform where the scanning distortion is relatively light, is used for imaging. As a result, the screen display time during specimen observation increases, and the observation throughput decreases. In addition, there is a problem that the throughput of the image stitching function and the accuracy of the image stitching function also decrease.

The present disclosure has been made in view of the above situations, and an object of the present disclosure is to propose a technique for appropriately correcting various types of distortion without a reduction in the observation throughput.

Solution to Problem

In order to solve the above problem, the purpose of the present disclosure provides a charged particle beam device that obtains an image by irradiating a specimen with a charged particle beam and includes: a deflection coil that scans the charged particle beam on the specimen; a D/A converter that converts a digital scan waveform to an analog scan waveform and outputs the analog scan waveform to the deflection coil to drive the deflection coil; and a scan waveform generation unit that generates the digital scan waveform and outputs the digital scan waveform to the D/A converter. The scan waveform generation unit has a basic LUT that stores parameters for correcting the digital scan waveform and includes a correction circuit that corrects the distortion characteristics of the deflection coil.

Further features related to the present disclosure will be apparent from the description of the specification and the accompanying drawings. In addition, the aspects of the present disclosure are achieved and attained by means of the elements and combinations of various elements and aspects of the detailed description described below and aspects of the appended claims.

The description of the specification is merely exemplary and is not intended to limit the claims or application example of this disclosure in any way.

Advantageous Effects of Invention

According to the technology of the present disclosure, it is possible to appropriately correct various types of distortion in a charged particle beam device without a reduction in observation throughput.

BRIEF DESCRIPTION OF DRAWINGS

FIG. 1 is a diagram showing a configuration example of a scanning electron microscope according to an embodiment.

FIG. 2 is a diagram showing an internal configuration example of a scan waveform generation device 112 (including a linear approximation correction unit, which will be described below) in a first mode.

FIG. 3 is a diagram showing a schematic internal configuration example of a basic LUT correction unit 204 and a linear approximation correction unit 205 in the first mode.

FIG. 4 is a diagram showing a configuration example of a Graphical User Interface (GUI) of a charged particle beam device according to an embodiment.

FIG. 5 is a schematic diagram showing rising and falling portions of a scan waveform.

FIG. 6 is a flowchart provided to explain a distortion correction process by linear approximation according to an embodiment.

FIG. 7 is a diagram showing a specific example of a correction process for a X-direction scan waveform signal by the linear approximation.

FIG. 8 is diagram showing an example of a method of calculating a slope value and a calculation formula.

FIG. 9 is a diagram showing a comparison of circuit size between a method of correcting entirely with an LUT (comparative example) and a method of correcting with a basic LUT and a linear approximation (embodiment).

FIG. 10 is a diagram showing an internal configuration example of the scan waveform generation device 112 (including a curve approximation correction unit) in a second mode.

FIG. 11 is a flowchart provided to explain the distortion correction process by the curve approximation according to an embodiment (second mode).

FIG. 12 is a diagram showing a configuration example of an arithmetic circuit for curve approximation correction (second mode).

FIG. 13 is a diagram showing a comparison result of the circuit size between a method of performing correction entirely with a LUT (comparative example) and a method of performing a basic LUT correction and curve approximation correction (second mode).

FIG. 14 is a diagram showing an internal configuration example of a waveform acquisition unit 110 according to an embodiment.

FIG. 15 is a diagram schematically showing an image stitching function of the charged particle beam device of an embodiment.

FIG. 16 is a flowchart provided to explain correction value calculation process by simulation evaluation.

FIG. 17 is a flowchart provided to explain correction value calculation process by the waveform acquisition unit 110.

FIG. 18 is a flowchart provided to explain correction value calculation process at the time of device shipment.

FIG. 19 is a flowchart provided to explain correction value calculation process when the device is used by a user.

DESCRIPTION OF EMBODIMENTS

The embodiment relates to a charged particle beam device for observing specimens in a wide range of fields such as semiconductor devices, electronics, advanced nanotechnology materials, biology, pharmaceuticals, and the like, and particularly, to controlling scanning that scans electron beams to obtain images. Such a charged particle beam device can be applied to a semiconductor inspection device and a length measuring device, for example.

More specifically, in the embodiment, in order to appropriately correct the various types of distortion without a reduction in observation throughput, an inverse characteristic of an error from a scan waveform (an ideal scan waveform to be described below) that serves as a reference for correction is obtained using basic parameters stored in a basic LUT, and a distortion due to a delay in the response of a deflection coil is corrected, the basic parameters are changed by a linear approximation waveform or a curve approximation waveform for a plurality of change points of the inverse characteristic of an amount of distortion corresponding to each condition (scanning speed, magnification, rotation, and the like), and the amount of distortion corresponding to each condition is corrected using the changed parameters, and a scan waveform to drive the deflection coils is outputted.

Hereinafter, the embodiment will be described with reference to the drawings. In the embodiment, a scanning electron microscope will be described as an example of a charged particle beam device, but the technique of the present disclosure may also be applicable to the other charged particle beam devices.

<Configuration Example of Scanning Electron Microscope>

FIG. 1 is a diagram showing a configuration example of a scanning electron microscope according to an embodiment. As shown in FIG. 1, a scanning electron microscope 100 includes an electron source 101, a first condenser lens 102, a second condenser lens 103, a deflector 104, a housing 105, an objective lens 106, a specimen chamber 107, a specimen 108, an amplifier 109, the waveform acquisition unit 110, a D/A converter 111, the scan waveform generation device 112, and a computer 113 with a display (hereinafter, also sometimes simply referred to as a "computer").

The electron source 101 is generally accelerated to 0.5 kV to 30 kV and emits an electron beam (primary electron beam). A plurality of stages of lenses including the first condenser lens 102, the second condenser lens 103, and the like are controlled to conditions suitable for observation, and have the function of converging the primary electron beam. In addition, the deflector 104 has a function of varying the scanning speed. Secondary electrons and reflected electrons are emitted from the specimen 108 upon irradiation of the primary electron beam.

The scan waveform generation device 112 outputs an analog waveform to the deflector 104 via the D/A converter 111. The deflector 104 is controlled by the input scan waveform to scan the irradiation position of the primary electron beam on the specimen 108 according to the desired observation field range. In addition, the scan waveform generation device 112 also supplies the same analog waveform as the output to the deflector 104 to the waveform acquisition unit 110.

The waveform acquisition unit 110 receives the same waveform signal as that output to the deflector 104 and causes an A/D converter 114 to convert the analog signal into a digital signal. Then, the waveform acquisition unit 110 stores the obtained digital waveform signal (waveform data) in the obtained waveform storage memory, and outputs the stored waveform data to the scan waveform generation device 112. By comparing this waveform data with a reference waveform (ideal waveform: scan waveform at the slowest scanning speed) for distortion detection and correction, it is possible to detect the presence or absence of scan distortion even before the specimen 108 is actually irradiated with the primary electron beam.

The scan waveform generation device 112 includes a scan generation unit 201 and the linear approximation correction unit 205, as will be described below (see FIG. 2), and the magnification distortion, distortion of the current flowing in the deflection coil of the electron beam, scanning speed, and distortion due to the scanning direction (raster rotation) of the electron probe can be corrected for each condition.

The image is displayed on the computer 113 with the display in synchronization with the scanning of the primary electron beam. In addition, the computer 113 with the display also includes a display means for displaying the formed images, an information input means for inputting information necessary for operating the device to the GUI displayed on the display means, and the like. Each component of the electron optical system, such as the acceleration voltage of the primary electron beam, the probe current irradiating the specimen 108, and the like are adjusted automatically or by inputting desired values on the computer 113 with the display by the user.

<Internal Configuration Example of Scan Waveform Generation Device 112 in First Mode>

FIG. 2 is a diagram showing an internal configuration example of the scan waveform generation device 112 in the first mode (linear approximation, which will be described below). The scan waveform generation device 112 receives commands from the computer 113 (a scan setting command for designating scan parameters and a correction command for obtaining a distortion correction value) and an output from the waveform acquisition unit 110, and includes the scan generation unit 201, a basic LUT correction unit 204-1 that corrects a X-direction scan signal 202, a basic LUT correction unit 204-2 that corrects a Y-direction scan signal 203, the linear approximation correction unit 205, and a time correction unit 206. The linear approximation correction unit 205 includes a scanning speed correction unit 207-1 that corrects scanning speed distortion in the X-direction, a scanning speed correction unit 207-2 that corrects scanning speed distortion in the Y-direction, a magnification correction unit 208-1 that corrects magnification distortion in the X-direction, a magnification correction unit 208-2 that corrects magnification distortion in the Y-direction, a rotation correction unit 209-1 that corrects rotational (raster rotation) distortion in the X-direction, and a rotation correction unit 209-2 that corrects rotational (raster rotation) distortion in the Y-direction.

Since the degree of distortion increases or decreases with the scanning speed (there are several types from fast to slow) corresponding to the scan setting command, the scanning speed correction units 207-1 and 207-2 have correction parameters according to the conditions of each scanning speed, and correct the distortion of the scanning speed. In addition, since the degree of distortion increases or decreases with the magnification (there are several types from small to large) corresponding to the scan setting command, the magnification correction units 208-1 and 208-2 have correction parameters according to the conditions of each scan magnification, and correct the distortion of the scan magnification. Furthermore, since the degree of distortion increases or decreases with the rotation corresponding to the scan setting command (there are several kinds of rotation angles in the scanning direction, from small to large), the rotation correction units 209-1 and 209-2 have correction parameters according to the conditions of the rotation angle in each scanning direction, and correct distortion due to scanning rotation.

Time correction units 206-1 and 206-2 correct (adjust) the delay time due to the scan distortion correction process. As a result, it is possible to prevent the occurrence of a time difference between when the specimen 108 is scanned without correction and when the specimen 108 is scanned with correction.

<Internal Configuration Example of Basic LUT Correction Unit 204 and Linear Approximation Correction Unit 205 in First Mode>

FIG. 3 is a diagram showing a schematic internal configuration example of the basic LUT correction unit 204 and the linear approximation correction unit 205 in the first mode.

The basic LUT correction unit 204 has a table that stores correction value data corresponding to 16-bit input X-coordinate value in advance, which is the inverse characteristic of the distortion, and outputs the conversion data corresponding to the input X-coordinate value to correct distortion. For example, when the data width of the X coordinate value is 16 bits, since the number of X coordinates is 65536, the memory capacity of the LUT is approximately 1 Mbit. In the embodiment, only the basic LUTs are prepared, and the LUTs for distortion correction for each of X scanning and Y scanning with respect to scanning speed, observation magnification, and rotation are not prepared. For example, the memory capacity of the basic LUT is approximately 1 Mbit when the coordinates are represented by 16-bit digital data, and approximately 2 Mbits when represented by two equations of the X coordinate and the Y coordinate. With this level of capacity, it can be incorporated in an Field-Programmable Gate Array (FPGA), for example, eliminating the need for an external memory. Therefore, cost reduction can be realized. In the related example, since LUTs for distortion correction are prepared for each of X scan and Y scan with respect to scanning speed, observation magnification, and rotation, the total memory capacity is about 8.4 Mbits.

The linear approximation correction unit 205 does not perform correction for all X coordinate values unlike a smooth curve drawn with the correction value data of the LUT as in the related example, but instead approximates the curve with a straight line and performs distortion correction for each (scanning speed, observation magnification, rotation). The linear approximation correction unit may be configured with a multiplier 301, an adder 302, a selector 303, a comparator 304, and a register, for example. The register is necessary for setting the slope, offset, and change point setting values of the parameters used in the distortion correction. Since the parameters to be set in the register are provided for one change point, the number of parameters to be set in the register increases or decreases according to the number of change points. Therefore, in the embodiment, the memory capacity can be reduced as compared with the method (related example) in which all corrections are performed using LUTs. In other words, in the embodiment, the LUT is provided only in the basic LUT correction unit 204, and no LUT is provided in the others (the linear approximation correction unit 205 or a curve approximation correction unit 1001, which will be described below). Accordingly, the memory capacity can be reduced.

<Example of GUI Configuration>

FIG. 4 is a diagram showing a configuration example of a Graphical User Interface (GUI) according to an embodiment. A GUI 401 displayed on the display of the computer 113 with the display includes an observation screen 402, a distortion correction mode switching unit 403, a correction value acquisition unit 404, a correction value setting unit 405, and an observation condition setting unit 406, for example. The observation screen 402 is a display area for the user to visually confirm the observation specimen. The observation condition setting unit 406 is an area for the user to set (to set to any value) a scanning speed value, an observation magnification value, and a rotation value (angle value). The distortion correction mode switching unit 403 is an area for the user to set a desired distortion correction mode.

The correction value acquisition unit 404 is an area used when obtaining a correction value. The correction value setting unit 405 is an area used when setting correction values in the basic LUT correction units 204-1 and 204-2, the linear approximation correction unit 205, or the curve approximation correction unit 1001 (described below). In the embodiment, the user can arbitrarily select and switch, on the GUI 401, between a first mode that is a combination of the basic LUT correction and the linear approximation correction, a second mode that is a combination of the basic LUT correction and the curve approximation correction (described below), and a third mode that does not use the rising portion and falling portion of the scan waveform for imaging.

<Rising Portion and Falling Portion of Scan>

FIG. 5 is schematic diagram showing rising and falling portions of a scan. When the first mode and the second mode are selected, the scan waveform is corrected to an ideal waveform with high linearity, and thus, it is possible to use the rising portion and the falling portion, which are relatively easily distorted, for imaging. Therefore, observation throughput is improved more than in the third mode.

For example, in the third mode in which the rising portion and the falling portion of scan are not used for imaging, in the case of high-speed scanning with a screen size of 1280×960, it takes 200 μs per X scan. Meanwhile, in the first and second modes, it takes 125 μs, which is a reduction of about 70 ms per image. In the third mode, only the central portion of the scan waveform with less distortion dependence and relatively high linearity is used for imaging, instead of performing calculation by correction. For this reason, the rising portion and falling portion of the scan waveform are not used for imaging. Therefore, it is possible to selectively suppress the charge-up due to the specimen of insulator that occurs at the start of scanning. By suppressing the charge-up, it is possible to improve the brightness unevenness of the observation image, but the throughput is lowered. In the embodiment, as described above, it is possible to selectively switch and set the first mode or the second mode when the user wants to improve the observation throughput on the GUI 401, and the third mode when the user wants to improve the brightness unevenness while visually confirming the observation screen 402.

<Details of Distortion Correction Process by Linear Approximation (First Mode)>

FIG. 6 is a flowchart provided to explain the distortion correction process by the linear approximation according to an embodiment. It is noted that the distortion correction is performed independently in the X- and Y-directions of the primary electron beam. Further, in the embodiment, process is performed in the order of scanning speed correction→magnification correction→rotation correction, but the order of these processes is arbitrary, and any correction process may be performed first.

(i) Step 601

After starting the process, the waveform acquisition unit 110 obtains a scan waveform and inputs it to the scan generation unit 201.

(ii) Step 602

The scan generation unit 201 compares the scan waveform obtained in step 601 with a reference waveform (ideal waveform: a waveform obtained by scanning at the slowest speed in the scanning electron microscope 100 (charged particle beam device, for example), and the scan waveform with the least distortion) for calculating the amount of distortion, and measures the difference between them as an amount of distortion.

(iii) Step 603

The scan generation unit 201 calculates an inverse characteristic of the amount of distortion measured in step 602.

(iv) Step 604

The scan generation unit 201 sets a correction value, which is the inverse characteristic calculated in step 603, for the LUTs of the basic LUT correction units 204-1 and 204-2.

(v) Step 605

The scan generation unit 201 sets the scanning speed to any number of patterns, calculates a correction value (parameter) of the inverse characteristic from the amount of distortion for each setting, and sets the correction value for linear approximation correction with respect to the scanning speed correction units 207-1 and 207-2.

(vi) Step 606

The scan generation unit 201 arbitrarily sets magnification to any number of patterns in the same manner as the scanning speed, calculates a correction value (parameter) of the inverse characteristic from the resulting amount of distortion, and sets the correction value for linear approximation correction with respect to the magnification correction units 208-1 and 208-2.

(vii) Step 607

The scan generation unit 201 sets rotation (rotation angle) to any number of patterns, calculates a correction value (parameter) for the amount of distortion for each pattern, and sets the correction value for linear approximation correction with respect to the rotation correction units 209-1 and 209-2.

(viii) Step 608

Then, the scan waveform output from the scan generation unit 201 is corrected (distortion correction and delay time adjustment) in the basic LUT correction units 204-1 and 204-2, the scanning speed correction units 207-1 and 207-2, the magnification correction units 208-1 and 208-2, the rotation correction units 209-1 and 209-2, and the time correction units 206-1 and 206-2, respectively, and output to the D/A converter 111. Then, the D/A converter 111 converts the digital waveform into an analog waveform and outputs it to the deflector 104.

(ix) Step 609

The deflector scans the primary electron beam with a scan waveform with high linearity to display an image without distortion.

<Example of Scan Waveform Correction by Linear Approximation (First Mode)>

A specific example of distortion correction process by linear approximation shown in the flowchart described above will be described. FIG. 7 is a diagram showing a specific example of correction process for a X-direction scan waveform signal by the linear approximation.

The scan generation unit 201 obtains the amount of distortion, which is the difference between the reference waveform (ideal linear waveform) and the distorted measurement waveform, and sets the inverse characteristic of the amount of distortion in the basic LUT correction unit 204-1. Then, the basic LUT correction unit 204-1 distorts the scan waveform signal in the opposite direction. As a result, the amount of distortion that varies according to the delay in response of a deflection coil 1401 is canceled by the amount of distortion in the opposite direction with the basic LUT, and is corrected to a scan waveform with high linearity.

In the example of FIG. 7, the number of change points for linear approximation is four for each of scanning speed correction, magnification correction, and rotation correction. For this reason, for each of these, change points a, b, c, and d, slopes 1, 2, 3, 4, and 5 connecting each change point and the end point, and offsets 1, 2, 3, 4, and 5 corresponding to each slope are stored in an obtained waveform storage memory 115 in the waveform acquisition unit 110 as parameters of the correction value.

<Calculation of Slope Value (First Mode)>

FIG. 8 is diagram showing an example of a method of calculating a slope value and a calculation formula. By the method of calculating a slope 2, it is a value obtained by dividing the value obtained by subtracting the offset 2 from the X coordinate value of the change point b by the time value of the change point b. When linear approximation correction is performed for the distortion of the X scan of the scanning speed, there is a total of 14 types of parameters to be set in the registers at the four change points (slope→5 types; value of the horizontal axis of the change point→4 types; offset value→5 types). Since each correction unit is accessed from a computer for register setting, as the number of parameters to be set in the registers increases, the number of accesses increases and the time required for correction also increases.

Distortion due to each observation condition is corrected in real time by using a linear approximation waveform drawn from the change points a, b, c, and d, and the slopes 1, 2, 3, 4, and 5 corresponding to each change point and end point, which are the stored correction value parameters.

When the scanning is fast, the scanning is delayed and the scanning waveform is distorted. The amount of distortion for each scanning speed is measured in advance, and the correction value, which is the inverse characteristic thereof, is stored in the obtained waveform storage memory 115 in the waveform acquisition unit 110. Then, the amount of distortion due to the influence of the scanning speed can be canceled by a linear approximation waveform drawn from the change points a and b, which are the stored correction value parameters, and the slopes 1, 2, and 3 corresponding to each point and the end point. By canceling the amount of distortion, an ideal waveform with high linearity can be generated.

When the condition of the observation magnification is low magnification, that is, when the scanning is performed over a wide range, since the beam is scanned to the end in the X-direction and the range in which the beam returns to the end on the opposite side of the beginning of the beam scan is far, and the scan for scanning the beam is delayed and the waveform is distorted. In this case, the distortion of the waveform due to the magnification is measured, and the correction value, which is the inverse characteristic thereof, is stored in the obtained waveform storage memory 115 in the waveform acquisition unit 110. Then, the amount of distortion due to the influence of magnification can be canceled by a linear approximation waveform drawn from the change points a and b, which are the stored correction value parameters, and the slopes 1, 2, and 3 corresponding to each point and the end point. By canceling the amount of distortion, an ideal waveform with high linearity can be generated.

Since the scanning direction of the scan signal is changed by raster rotation (rotation of the observation screen), which is an operation auxiliary function, the scan waveform may be distorted. An amount of distortion at each rotation angle is measured, and a correction value, which is the inverse characteristic of the measured amount of distortion, is stored in the obtained waveform storage memory 115 in the waveform acquisition unit 110. A linear approximation waveform is drawn from the change points a and b, which are the stored correction value parameters, and slopes 1, 2, and 3 connecting each point and the end point. Then, by calculating the drawn linear approximation waveform and the distorted waveform, the distortion due to rotation can be canceled.

Since the scan waveform signal before correction passes through the circuit after scan generation, it is delayed from the actual correction timing. Therefore, the time correction unit 206 can adjust the timing of correction by register setting.

<Circuit Size (First Mode)>

FIG. 9 is a diagram showing a comparison of circuit size between a method of correcting entirely with an LUT (comparative example) and a method of correcting with a basic LUT and a linear approximation (embodiment). It can be seen that according to the embodiment, the memory capacity can be reduced to about 25% of that of the comparative example. In addition, it can be seen that the register setting time (the time required to transmit the parameters from the storage unit to the calculation unit inside the FPGA) is only 0.05% of that of the comparative example. In other words, by linear approximation, distortion due to the magnification distortion, the distortion of the current flowing in the deflection coil of the electron beam, the scanning speed, and the scanning direction of the electronic probe (raster rotation) can be corrected for all conditions, such that the circuit size can be reduced, and a low-cost device can be realized. Moreover, the register design time can be shortened, and it is also possible to cope with high-speed scanning.

In the embodiment, the amount of distortion of the deflection coil is corrected by the basic LUT correction unit, and the distortion that is changed according to each viewing condition is corrected in real time by linear approximation correction.

<Internal Configuration Example of Scan Waveform Generation Device 112 in Second Mode>

FIG. 10 is a diagram showing an internal configuration example of the scan waveform generation device 112 in the second mode. The scan waveform generation device 112 receives commands from the computer 113 (a scan setting command for designating scan parameters and a correction command for obtaining a distortion correction value) and an output from the waveform acquisition unit 110, and includes the scan generation unit 201, the basic LUT correction unit 204-1 that corrects the X-direction scan signal 202, the basic LUT correction unit 204-2 that corrects the Y-direction scan signal 203, the curve approximation correction unit 1001, and the time correction unit 206. The curve approximation correction unit 1001 includes a scanning speed correction unit 1002-1 that corrects scanning speed distortion in the X-direction, a scanning speed correction unit 1002-2 that corrects scanning speed distortion in the Y-direction, a magnification correction unit 1003-1 that corrects magnification distortion in the X-direction, a magnification correction unit 1003-2 that corrects magnification distortion in the Y-direction, a rotation correction unit 1004-1 that corrects rotational distortion in the X-direction, and a rotation correction unit 1004-2 that corrects rotational distortion in the Y-direction.

As in FIG. 2, the basic LUT correction units 204-1 and 204-2 have a table that stores correction value data corresponding to the 16-bit input X-coordinate value in advance, which is the inverse characteristic of the distortion, and outputs conversion data corresponding to the input X-coordinate value to correct distortion.

The curve approximation correction unit 1001 uses a small-capacity LUT to approximate the vicinity of the conversion point of the approximation straight line in the first mode (where the slope changes greatly) with a smooth curve to correct respective distortions (scanning speed, observation magnification, rotation). While the linear approximation correction has the steep slope near the change point and rough correction accuracy, the curve approximation correction can have a smooth correction with a small-capacity LUT, and thus has a higher correction precision than the linear approximation correction. In addition, by limiting the range of curve correction, it is possible to reduce the memory capacity and the correction time as compared with the comparative example described above. Note that small-capacity LUTs are prepared for each of the scanning speed correction units for X scanning and Y scanning, the magnification correction unit, and the rotation correction unit.

<Details of Distortion Correction Process by Curve Approximation (Second Mode)>

FIG. 11 is a flowchart provided to explain the distortion correction process by the curve approximation according to an embodiment (second mode). With the linear approximation correction of the first mode, since the slope near the change point changes greatly, the correction may be rough. Meanwhile, with the correction by curve approximation, by setting the correction value in a small-capacity LUT (separately from the basic LUT), the vicinity of the change point is smooth. Therefore, it is possible to make the correction accuracy higher than in the first mode.

(i) Step 1101

The scan generation unit 201 obtains a scan waveform obtained by the waveform acquisition unit 110.

(ii) Step 1102

The scan generation unit 201 compares the scan waveform obtained in step 1101 with a reference waveform for distortion measurement (ideal waveform: a waveform obtained by scanning at the slowest speed, for example), and measures the difference as an amount of distortion.

(iii) Step 1103

The scan generation unit 201 calculates an inverse characteristic of the amount of distortion measured in step 1102.

(iv) Step 1104

The scan generation unit 201 sets a correction value, which is the inverse characteristic to the basic LUT correction units 204-1 and 204-2.

(v) Step 1105

The scan generation unit 201 sets the scanning speed to any number of patterns, calculates a correction value (parameter) of the inverse characteristic from the amount of distortion obtained near each change point (the start point and end point are specified) of each pattern, and sets the correction value in the small-capacity LUT (not shown) of the scanning speed correction units 1002-1 and 1002-2.

(vi) Step 1106

Likewise, the scan generation unit 201 sets magnification to any number of patterns, calculates a correction value (parameter) of the inverse characteristic from the amount of distortion near each change point (the start point and end point are specified) of each pattern, and sets the correction value in the small-capacity LUTs (not shown) of the magnification correction units 1003-1 and 1003-2.

(vii) Step 1107

Likewise, the scan generation unit 201 sets rotation (angle) to any number of patterns, calculates a correction value (parameter) of the inverse characteristic from the amount of distortion near each change point (the start point and end point are specified) of each pattern, and sets the correction value in the small-capacity LUTs (not shown) of the rotation correction units 1004-1 and 1004-2.

(viii) Step 1108

Then, the scan waveform output from the scan generation unit 201 is corrected in the basic LUT correction units 204-1 and 204-2, the scanning speed correction units 1002-1 and 1002-2, the magnification correction units 1003-1 and 1003-2, and the rotation correction units 1004-1 and 1004-2, and output to the D/A converter 111. The D/A converter 111 converts the corrected digital waveform into an analog waveform and transmits the converted scan waveform (analog waveform) to the deflector 104.

(ix) Step 1109

The deflector 104 displays an image without distortion by scanning the primary electron beam. It is noted that the correction is performed independently in the X- and Y-directions of the primary electron beam.

<Configuration Example of Arithmetic Circuit for Curve Approximation Correction (Second Mode)>

FIG. 12 is a diagram showing a configuration example of an arithmetic circuit for curve approximation correction (second mode). The arithmetic circuit for curve approximation correction may be configured with an adder 1203, a comparator 1204, a selector 1205, a data type conversion unit 1206, and a range selection unit 1207, for example.

The scan generation unit 201 calculates a start point 1201 and an end point 1202 (start point and end point of the portion to be curve-approximated (near the change point): information indicating to which range the small-capacity LUT is applied for curve approximation) from the calculation result of the small-capacity LUT, and sets the registers. The comparator 1204 compares the scan coordinates with the calculated start point 1201 and end point 1202. The range selection unit 1207 selects a range, and the selector 1205 controls whether or not to correct the scan waveform. For example, correction is performed by adding 16-bit scan coordinates and 9-bit small-capacity LUT data, and output after the data type is converted to integer data.

<Comparison of Circuit Size: Comparative Example vs Second Mode>

FIG. 13 is a diagram showing a comparison result of the circuit size between a method of performing correction entirely with a LUT (comparative example) and a method of performing a basic LUT correction and curve approximation correction (second mode).

As an example of the configuration of the small-capacity LUT, if the signed data width is 9 bits and the depth is 512, the memory capacity is approximately 4.6 Kbits, and the sum of the correction units of X-scan and Y-scan is about 27 Kbits. Even if the memory capacity of the basic LUT is added, it is about 2.15 Mbits, which is about a quarter of the comparative example. Unlike the linear approximation correction, the second mode is a calculation using a LUT (small-capacity LUT), so only one calculator is used for each correction unit. Therefore, the number of calculators used is reduced compared to the first mode. In addition, it can be seen that the register setting time (the time required to transmit the parameters from the storage unit to the calculation unit inside the FPGA) is approximately 1% of that of the comparative example, and distortion correction can be performed in real time.

<Configuration Example of Waveform Acquisition Unit>

FIG. 14 is a diagram showing an internal configuration example of the waveform acquisition unit 110 according to an embodiment. The waveform acquisition unit 110 includes the A/D converter 114, the obtained waveform storage memory 115, the deflection coil 1401, a current sensor 1402, and a resistor 1403. The waveform acquisition unit 110 measures the current of the deflection coil 1401 with the current sensor 1402 and then compare it with a reference waveform (ideal waveform: waveform obtained by the slowest scan) to obtain an amount of distortion. Then, the amount of distortion is recorded in the obtained waveform storage memory 115 and outputs to the scan waveform generation device 112 as a scan waveform.

In addition, in the waveform acquisition unit 110, the current range can be adjusted with the resistor 1403, and a current waveform with a desired level can be obtained. As a result, it is possible to obtain not only the distortion due to the response delay of the deflection coil 1401, but also the scan distortion due to each observation condition by using the device. In other words, it is possible to correct the distortion due to a slight difference between devices and also the scan distortion due to aging deterioration of the device as many times as necessary.

<Image Stitching Function>

FIG. 15 is a diagram schematically showing an image stitching function according to an embodiment. The image stitching function is a function of capturing a plurality of images and stitching them together by software process to generate a single image. In the related mode (third mode), when capturing images before stitching, the scanning time is increased and an image without distortion is obtained (images in the rising and falling portions are not used for image generation), and this significantly reduces the throughput of the image stitching function. In addition, since the beam is irradiated with the increased scanning, the damage to the specimen is also exacerbated.

Meanwhile, in the first mode and the second mode of the embodiment, since the images of the rising portion and the falling portion are used, the scanning time is reduced, thereby improving the throughput. Furthermore, since it is not necessary to irradiate the stitching portion in the increased scan with the beam, it is possible to improve the accuracy of the stitching of the images, and reduce the damage to the specimen.

<Correction by Simulation Evaluation>

FIG. 16 is a flowchart provided to explain correction value calculation process by simulation evaluation.

(i) Step 1601

The computer 113 performs simulation evaluation from the design values of the charged particle beam device, and calculates a correction value which is the inverse characteristic of the scan output waveform from the simulation results.

(ii) Step 1602

The computer 113 calculates digitized digital values of the inverse characteristic from the scanned distorted analog waveform. The calculation of the digitized digital value of the inverse characteristic is performed for each of the X-direction scan and the Y-direction scan.

(iii) Step 1603

The computer 113 sets the correction values calculated in step 1602 in the basic LUT correction units 204-1 and 204-2.

It is noted that, in the simulation evaluation, since only the correction values stored in the basic LUT can be calculated, the amount of distortion due to each of the scanning speed, the observation magnification, and rotation cannot be measured. However, since the distortion due to the delay in response of the deflection coil 1401 can be measured, it is possible to obtain the correction value of the inverse characteristic. Therefore, the amount of distortion of the deflection coil 1401 can be evaluated at the design stage.

<Correction Value Calculation Process by Waveform Acquisition Unit 110>

FIG. 17 is a flowchart provided to explain correction value calculation process by the waveform acquisition unit 110. The correction value calculation process by the waveform acquisition unit 110 can be performed at the stage where there is only the FPGA circuit present (in this stage, the actual charged particle beam device is not present yet).

(i) Step 1701

The waveform acquisition unit 110 measures a scan output waveform.

(ii) Step 1702

The waveform acquisition unit 110 calculates a digital value of an inverse characteristic from the scan waveform measured in step 1701. When calculating the digital value of the inverse characteristic, the waveform acquisition unit 110 calculates each of X-direction scan and Y-direction scan. In addition, the waveform acquisition unit 110 calculates correction values for each of the scanning speed, observation magnification, and rotation.

(iii) Step 1703

The waveform acquisition unit 110 sets values in the basic LUT correction units 204-1 and 204-2.

(iv) Step 1704

The waveform acquisition unit 110 sets the correction values in the linear approximation correction unit 205 or the curve approximation correction unit 1001 for each of X-direction scan and Y-direction scan.

The correction value calculation process by the waveform acquisition unit 110 is not the process for calculating a correction value using an actual charged particle beam device. For this reason, it is not possible to measure the amount of distortion due to differences between devices. However, the distortion due to the deflection coil 1401 and each observation condition can be measured, and various distortions can be corrected.

<Correction Value Calculation Process at Time of Device Shipment>

FIG. 18 is a flowchart provided to explain correction value calculation process at the time of device shipment. That is, this correction value calculation process relates to acquisition of correction values using an actual device.

(i) Step 1801

The scan generation unit 201 measures a scan output waveform from the device at the time of shipment.

(ii) Step 1802

The scan generation unit 201 calculates a digitized digital value of an inverse characteristic from an analog value of the scan distortion waveform.

(iii) Step 1803

The scan generation unit 201 sets the digital value calculated in step 1802 in the basic LUT correction units 204-1 and 204-2.

(iv) Step 1804

The scan generation unit 201 calculates the inverse characteristics of the distortion due to the scanning speed, observation magnification, and rotation for each of X-direction scan and Y-direction scan, and sets the calculated results in the linear approximation correction unit 205 or the curve approximation correction unit 1001.

In this case, since the scan waveform is measured by the device at the time of shipment, it is not possible to correct the distortion due to aging deterioration after shipment. However, since the correction can be performed for each device before shipment, it is possible to correct the distortion due to device difference.

<Correction Value Calculation Process by User>

FIG. 19 is a flowchart provided to explain correction value calculation process when the device is used by a user.

(i) Step 1901

The scan generation unit 201 measures a scan output waveform from a device after shipment (a device in use: for example, a charged particle beam device that has been used for many years).

(ii) Step 1902

The scan generation unit 201 calculates a digital value of an inverse characteristic from the scan waveform measured in step 1901. When the digital value of the inverse characteristic is calculated, it is calculated for each of X-direction scan and Y-direction scan. In addition, the scan generation unit 201 calculates correction values for scanning speed, observation magnification, and rotation for each of X-direction scan and Y-direction scan.

(iii) Step 1903

The scan generation unit 201 sets the correction values in the basic LUT correction unit 204.

(iv) Step 1904

The scan generation unit 201 sets the correction values in the linear approximation correction unit 205 or the curve approximation correction unit 1001.

(v) Step 1905

The scan generation unit 201 measures the scan waveform again in response to the user's instruction.

(vi) Step 1906

The scan generation unit 201 obtains a correction value from the waveform measured in step 1905, and resets the correction value in the basic LUT correction units 204-1 and 204-2. Likewise, the scan generation unit 201 resets the correction values in the linear approximation correction unit 205 or the curve approximation correction unit 1001 for each scanning speed, observation magnification, and rotation. In other words, after shipment, the user can arbitrarily re-correct the scan distortion due to aging deterioration of the device. Therefore, the user himself/herself can perform the maintenance of the device.

MODIFICATION EXAMPLE

The charged particle beam device 100 may be provided with respective functions corresponding to the first, second, and third modes described above, and select one of them to scan and observe the specimen 108, or may be provided with a function corresponding to the first mode or the second and third modes and observe the specimen 108. In addition, the charged particle beam device 100 may be configured to have the function of either the first mode or the second mode.

SUMMARY (i) According to the embodiment, the distortion characteristics of the deflection coil are corrected using the basic LUT that stores the parameters for correcting the scan waveform (digital scan waveform). Further, in the embodiment, the linear approximation correction unit 205 and the curve approximation correction unit 1001 change the correction parameters obtained from the basic LUT according to the conditions including at least one of the scanning speed, the magnification, and the rotation. Specifically, the correction parameters include a combination of: (i) stored in the basic LUT, a first set of parameters of the inverse characteristic of the distortion characteristic under a predetermined condition (parameters for correcting distortion due to a delay in the response of the deflection coil); and (ii) a second set of parameters according to each condition of the scanning speed, the magnification, and the rotation (parameters generated by changing the correction parameters of the basic LUT according to each condition). The second set of parameters is a parameter for distortion correction by the linear approximation, or a parameter for distortion correction by the curve approximation, which correct distortion corresponding to conditions including at least one of the scanning speed, magnification, and rotation. After performing the first correction using the first set of parameters, the second correction (correction matching each condition) using the second set of parameters is performed to correct the distortion characteristic. By doing so, images without distortion can be observed successively under various observation conditions. In addition to improving the basic image quality by the basic LUT, the reproducibility of length measurement within the field of view, the accuracy of image analysis, and the image stitching function are also improved. Furthermore, distortion due to the magnification distortion, the distortion of the current flowing in the deflection coil of the electron beam, the scanning speed, and the scanning direction of the electronic probe (raster rotation) can be corrected for all conditions, such that the circuit size can be reduced, and a low-cost device can be realized by the linear approximation or the curve approximation. In addition, by scan distortion correction, the throughput and stitching accuracy of the image stitching function can be improved. Furthermore, since the scan waveform acquisition means can correct the scan distortion even after the device is shipped, the distortion due to aging deterioration can be re-corrected.

(ii) The functions of the embodiment can also be realized by software program code. In this case, a storage medium recording the program code is provided to the system or device, and the computer (or CPU or MPU) of the system or device reads the program code stored in the storage medium. In this case, the program code itself read from the storage medium implements the functions of the embodiments described above, and the program code itself and the storage medium storing the program code are included in the present disclosure. As a storage medium for supplying such a program code, for example, flexible disks, CD-ROMs, DVD-ROMs, hard disks, optical disks, magneto-optical disks, CD-Rs, magnetic tapes, non-volatile memory cards, ROMs, and the like are used.

In addition, based on the instructions of the program code, the operating system (OS) or the like running on the computer performs part or all of the actual processing, and the functions of the embodiments described above may be implemented by the processing. Furthermore, after the program code read from the storage medium is written into the memory of the computer, the CPU or the like of the computer may perform part or all of the actual processing based on the instructions of the program, and the functions of the embodiment described above may be implemented by the processing.

Further, the program code of the software for implementing the functions of the embodiments may be distributed through a network, so that the program code may be stored in a storage means such as a hard disk or a memory of a system or device or a storage medium such as a CD-RW or a CD-R, and at the time of use, the computer (or CPU or MPU) of the system or device may read and perform the program code stored in the storage means or storage medium.

Finally, it should be understood that the processes and techniques described herein are not inherently related to any particular device and can be implemented by any suitable combination of components. Moreover, various types of general purpose devices can be used in accordance with the teachings described herein. It may prove beneficial to construct specialized device to perform the method steps described herein. Moreover, various inventions can be formed by appropriately combining a plurality of constituent elements disclosed in the embodiments. For example, some components may be omitted from all components shown in the embodiments. Furthermore, components across different embodiments may be combined as appropriate. The disclosure has been described with reference to specific examples, which are intended in all respects to be illustrative rather than restrictive. Those skilled in the art will appreciate that there are numerous combinations of hardware, software, and firmware suitable for implementing the present disclosure. For example, the described software may be implemented in a wide variety of programming or scripting languages, such as assembler, C/C++, perl, Shell, PHP, Java (registered trademark), and the like.

Further, in the embodiments described above, the control lines and the information lines show those considered to be necessary for explanation, and it is not necessarily limited that all the control lines and information lines are shown necessarily on the product. All components may be interconnected.

Additionally, other implementations of the present disclosure will be apparent to those of ordinary skill in the art from consideration of the specification and embodiments of the present disclosure disclosed herein. Various aspects and/or components of the described embodiments may be used singly or in any combination. It is intended that the specification and examples be considered as exemplary only, with the scope and spirit of the disclosure being indicated by the following claims.

REFERENCE SIGNS LIST

101: electron source
102: first condenser lens
103: second condenser lens
104: deflector
105: housing
106: objective lens
107: specimen chamber
108: specimen
109: amplifier
110: waveform acquisition unit
111: D/A converter
112: scan waveform generation device
113: computer with display
114: A/D converter
115: obtained waveform storage memory
201: scan generation unit
202: X-direction scan signal
203: Y-direction scan signal
204: basic LUT correction unit
205: linear approximation correction unit
206: time correction unit
207: scanning speed correction unit
208: magnification correction unit
209: rotation correction unit
301: multiplier
302: adder
303: selector
304: comparator
401: GUI
402: observation screen
403: distortion correction mode switching unit
404: correction value acquisition unit
405: correction value setting unit
406: observation condition setting unit
1001: curve approximation correction unit
1201: start point
1202: end point
1203: adder
1204: comparator
1205: selector
1206: data type conversion unit
1207: range selection unit
1401: deflection coil
1402: current sensor
1403: resistor

The invention claimed is:

1. A charged particle beam device that obtains an image by irradiating a specimen with a charged particle beam, the charged particle beam device comprising:

a deflection coil that scans the charged particle beam on the specimen;

a D/A converter that converts a digital scan waveform into an analog scan waveform and outputs the analog scan waveform to the deflection coil to drive the deflection coil; and a scan waveform generation unit that generates the digital scan waveform and outputs the digital scan waveform to the D/A converter, wherein the scan waveform generation unit has a look up table that stores parameters for correcting the digital scan waveform and includes a correction circuit that corrects a distortion characteristic of the deflection coil, and wherein the scan waveform generation unit outputs the digital scan waveform according to a mode signal, and the mode signal is input from outside of the scan waveform generation unit and indicates whether to perform a correction of the distortion characteristic or to, without performing the correction of the distortion characteristic, capture an image without using a rising portion and a falling portion of the scan waveform.

2. The charged particle beam device according to claim 1, wherein the mode signal includes a first mode signal that instructs to perform the correction of the distortion characteristic by linear approximation, a second mode signal that instructs to perform the correction of the distortion characteristic by curve approximation, and a third mode signal that instructs to, without performing the correction of the distortion characteristic, capture an image without using a rising portion and a falling portion of a scan waveform, and when receiving the first mode signal or the second mode signal, the scan waveform generation unit causes the correction circuit to perform distortion correction corresponding to the first mode signal or the second mode signal, and outputs a corrected digital scan waveform, and when receiving the third mode signal, outputs the digital scan waveform without operating the correction circuit.

3. The charged particle beam device according to claim 2, wherein the correction circuit changes correction parameters according to conditions including at least one of scanning speed, magnification, and rotation.

4. The charged particle beam device according to claim 3, wherein the correction parameters are configured with a combination of (i) stored in the look up table, a first set of parameters of the inverse characteristic of the distortion characteristic under a predetermined condition, and (ii) a second set of parameters according to each condition of the scanning speed, the magnification, and the rotation, and the second set of parameters is a parameter for distortion correction by the linear approximation, or parameters for distortion correction by the curve approximation, which correct distortion corresponding to conditions including at least one of the scanning speed, the magnification, and the rotation, and the correction circuit performs a first correction using the first set of parameters and then performs a second correction using the second set of parameters to correct the distortion characteristic.

5. The charged particle beam device according to claim 3, wherein, when receiving the first mode signal, the scan waveform generation unit obtains an inverse characteristic of an error from a scan waveform serving as a reference for correction using the parameters stored in the look up table to correct a distortion due to a delay in a response of the deflection coil, and corrects an amount of distortion corresponding to the condition using parameters obtained by generating a linear approximation waveform for a plurality of change points of inverse characteristics of an amount of distortion corresponding to the condition, and outputs the corrected digital scan waveform.

6. The charged particle beam device according to claim 3, wherein, when receiving the second mode signal, the scan waveform generation unit obtains inverse characteristic of an error from a scan waveform serving as a reference for correction using the parameters stored in the look up table to correct a distortion due to a delay in a response of the deflection coil, and corrects an amount of distortion corresponding to the condition using parameters obtained by generating a curve approximation waveform for a plurality of change points of inverse characteristics of an amount of distortion corresponding to the condition, and outputs the corrected digital scan waveform.

7. The charged particle beam device according to claim 4, wherein the first set of parameters includes a set of parameters obtained by simulation evaluation based on design values of the charged particle beam device, a set of parameters calculated based on a distortion of a scan waveform that can be measured at a stage when the scan waveform generation unit is configured with an FPGA, a set of parameters calculated based on a distortion of a scan waveform measured using the charged particle beam device at a time of shipment, or a set of parameters calculated based on a distortion of a scan waveform measured by a user using the charged particle beam device after shipment.

8. The charged particle beam device according to claim 7, wherein the second set of parameters includes a set of parameters calculated based on a distortion of a scan waveform that can be measured at a stage when the scan waveform generation unit is configured with an FPGA, a set of parameters calculated based on a distortion of a scan waveform measured using the charged particle beam device at a time of shipment, or a set of parameters calculated based on a distortion of a scan waveform measured by a user using a charged particle beam device after shipment.

9. A scan waveform generation method of a charged particle beam device, the scan waveform generation method for generating a scan waveform of a charged particle beam to irradiate a specimen, comprising:

generating, by a scan waveform generation unit, the scan waveform and supplying the scan waveform to a deflection coil that scans the charged particle beam on the specimen; and correcting a distortion characteristic of the deflection coil using a look up table that stores a parameter for correcting the scan waveform;

wherein the supplying the scan waveform includes determining whether to correct the distortion characteristic in response to a mode signal, and outputting the scan waveform corresponding to the mode signal, the mode signal which is input from outside of the scan waveform generation unit and indicates whether to perform a correction of the distortion characteristic or to, without performing the correction of the distortion characteristic, capture an image without using a rising portion and a falling portion of the scan waveform.

10. The scan waveform generation method according to claim 9, wherein the mode signal includes a first mode signal that instructs to perform the correction of the distortion characteristic by linear approximation, a second mode signal that instructs to perform the correction of the distortion characteristic by curve approximation, and a third mode signal that instructs to, without performing the correction of the distortion characteristic, capture an image without using a rising portion and a falling portion of a scan waveform, and the supplying the scan waveform includes, when receiving the first mode signal or the second mode signal, performing distortion correction corresponding to the first mode signal or the second mode signal and outputting the corrected scan waveform, and when receiving the third mode signal, outputting the scan waveform without correcting the distortion characteristic.

* * * * *